United States Patent
Udrea

[19]

[11] Patent Number: 6,111,289
[45] Date of Patent: Aug. 29, 2000

[54] SEMICONDUCTOR DEVICE

[75] Inventor: Florin Udrea, Cambridge, United Kingdom

[73] Assignee: Fuji Electric Company Ltd., Matsumoto, Japan

[21] Appl. No.: 09/289,615

[22] Filed: Apr. 12, 1999

[30] Foreign Application Priority Data

Feb. 5, 1999 [JP] Japan ................................. 11-028841

[51] Int. Cl.[7] ............................................... H01L 29/772
[52] U.S. Cl. ................... 257/328; 257/133; 257/162; 257/168; 257/172; 257/212; 257/288; 257/355
[58] Field of Search ................................. 257/328, 329, 257/119, 122, 124, 126, 129, 130, 133, 128, 168, 287, 409, 557, 134, 162, 165, 167, 340, 341, 365, 241, 141, 369, 370, 288, 355, 172, 212

[56] References Cited

U.S. PATENT DOCUMENTS 5,621,229  4/1997  Huang ........................................ 257/212

Primary Examiner—Tom Thomas
Assistant Examiner—Shouxiang Hu
Attorney, Agent, or Firm—Dykema Gossett PLLC

[57] ABSTRACT

A semiconductor device has first and second electrical terminals. The device comprises at least one n/p or p/n first junction adjacent the first terminal, and at least one of the other of a p/n or n/p second junction adjacent the second terminal. It also has at least one n/p or p/n junction disposed between the first and second junctions and arranged to be transverse thereto, and at least one gate terminal in contact with the p or n doped region of the first junction or the n or p doped region of the second junction.

12 Claims, 11 Drawing Sheets

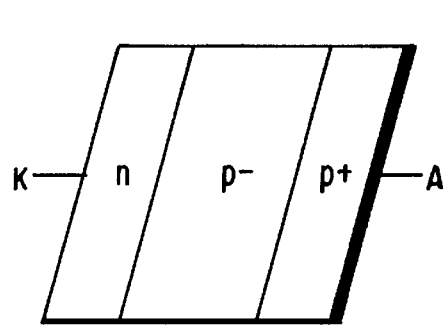
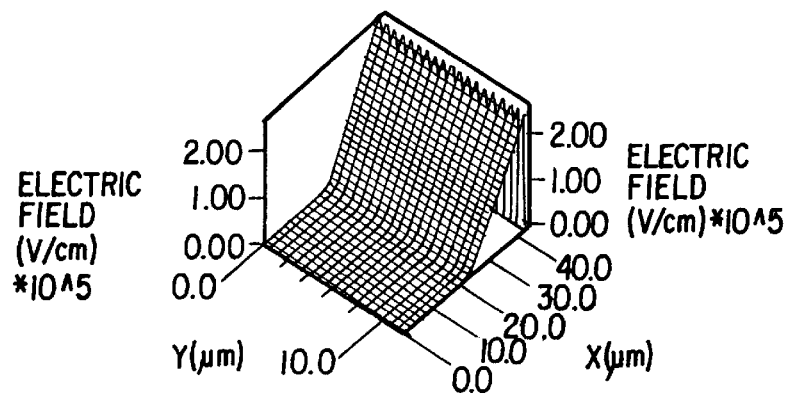
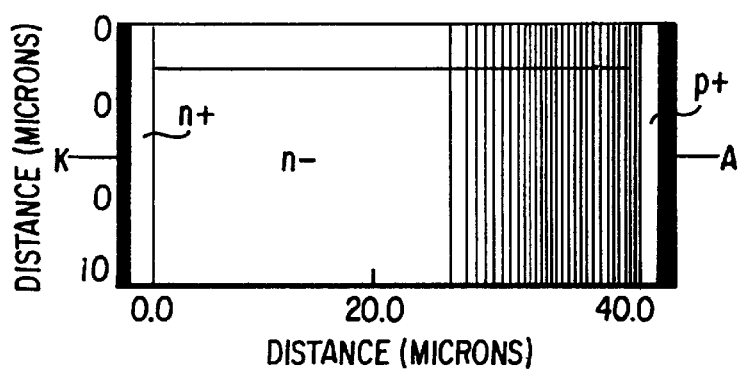
FIG. 3a (PRIOR ART)

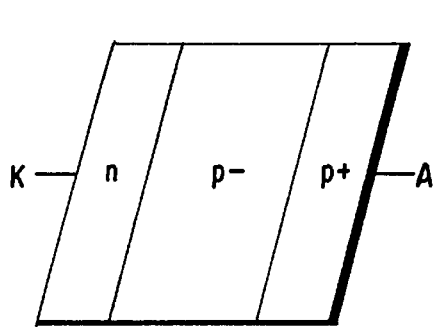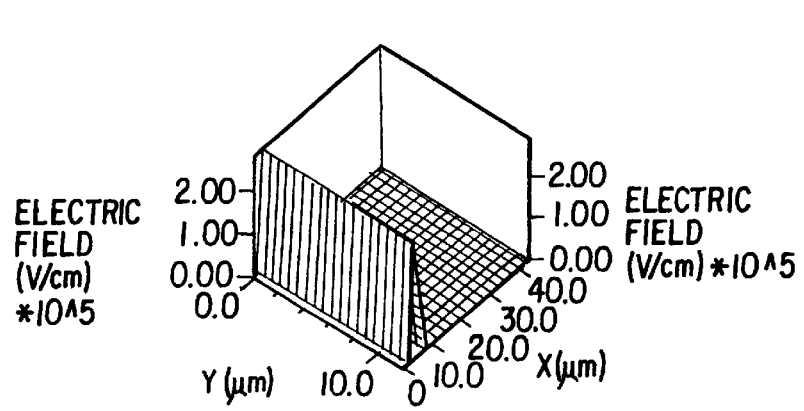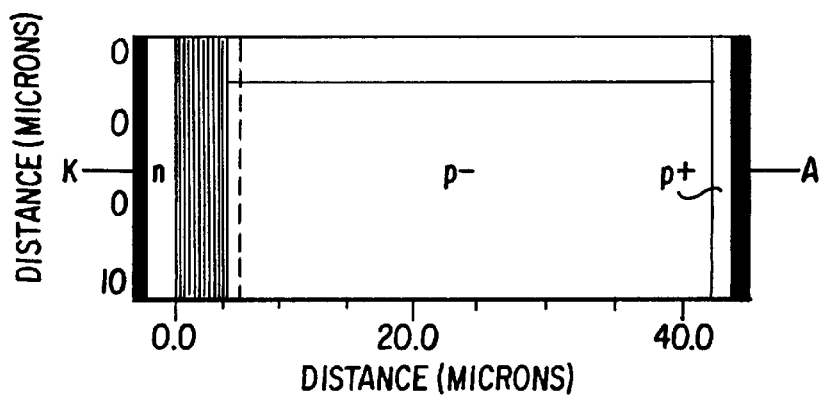
FIG. 3b
(PRIOR ART)

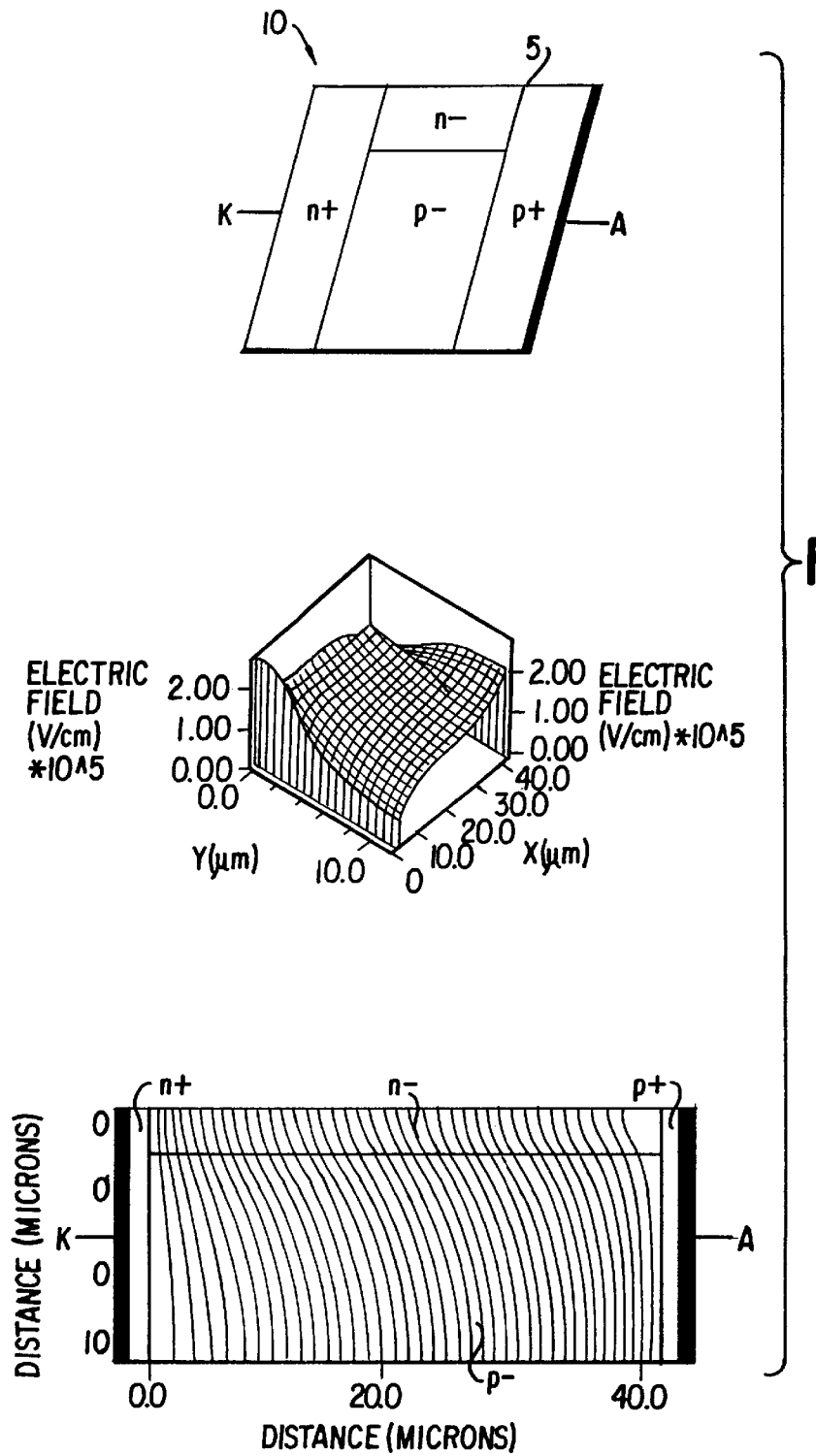

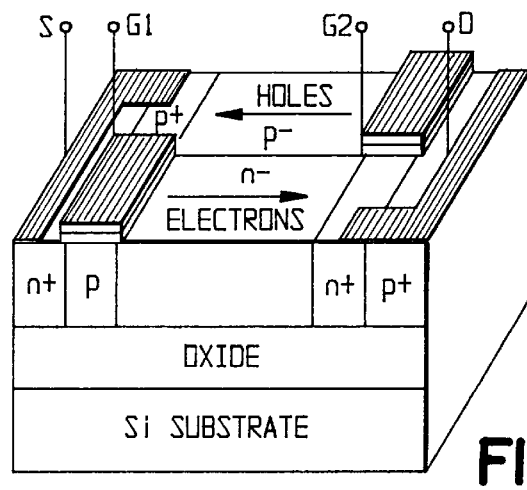
FIG. 8
FIG. 9
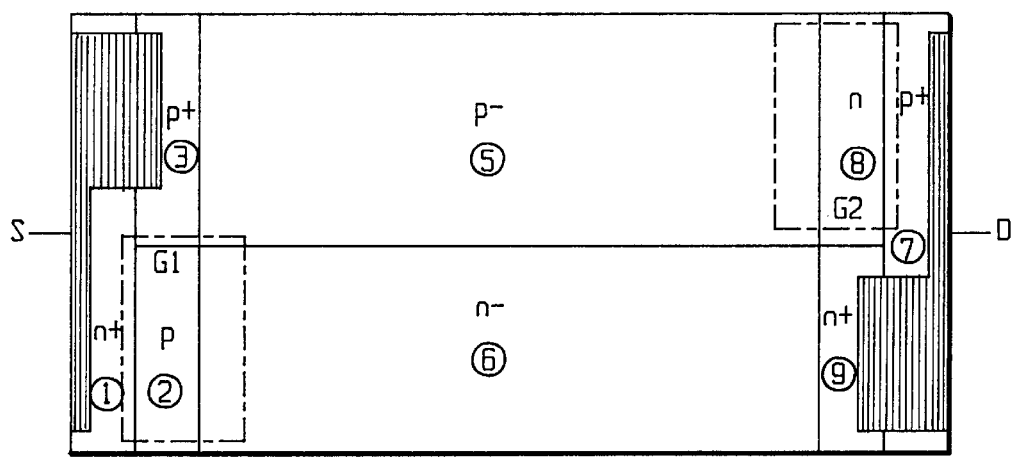

SEMICONDUCTOR DEVICE

BACKGROUND OF THE INVENTION

This invention relates to semiconductor devices. In particular, it relates to improvements in high voltage, large current, devices.

It has been a long desired goal in the field of semiconductor device design and manufacture to provide semiconductor devices which are capable to controlling high voltages and large currents. In particular, it has long been desirable to provide semiconductor devices which can withstand high voltages being applied across them without breaking down, and which can handle large currents during operation.

SUMMARY OF THE INVENTION

The present invention seeks to provide devices which meet this goal.

According to the present invention there is provided a semiconductor device having first and second electrical terminals, the device comprising:

- at least one n/p or p/n first junction adjacent the first terminal;
- at least one of the other of a p/n or n/p second junction adjacent the second terminal;
- at least one n/p or p/n junction disposed between the first and second junctions and arranged to be transverse thereto; and
- at least one gate terminal in contact with the p or n doped region of the first junction or the n or p doped region of the second junction.

The semiconductor device may have more than one gate, the gates arranged to control the flow of carriers through the device. The gates may be formed from metal or polysilicon on an insulating layer.

The device may be formed on a substrate consisting of an oxide layer on a silicon substrate or, alternatively, upon a p- or n- doped silicon substrate.

The device may be formed as part of an integrated circuit.

BRIEF DESCRIPTION OF THE DRAWINGS

One example of the present invention will now be described with reference to the accompanying drawings, in which:

FIGS. 3A and 3B are schematic diagrams showing conventional diodes and the electric fields and potential distribution associated therewith during reverse voltage bias;

FIG. 4 shows representations corresponding to those in FIGS. 3A and 3B but for the diode of FIG. 1;

FIG. 8 is a schematic perspective view of a further example of the present invention;

FIG. 9 is a plan view of the device of FIG. 8;

DESCRIPTION OF THE INVENTION

Figure 1:
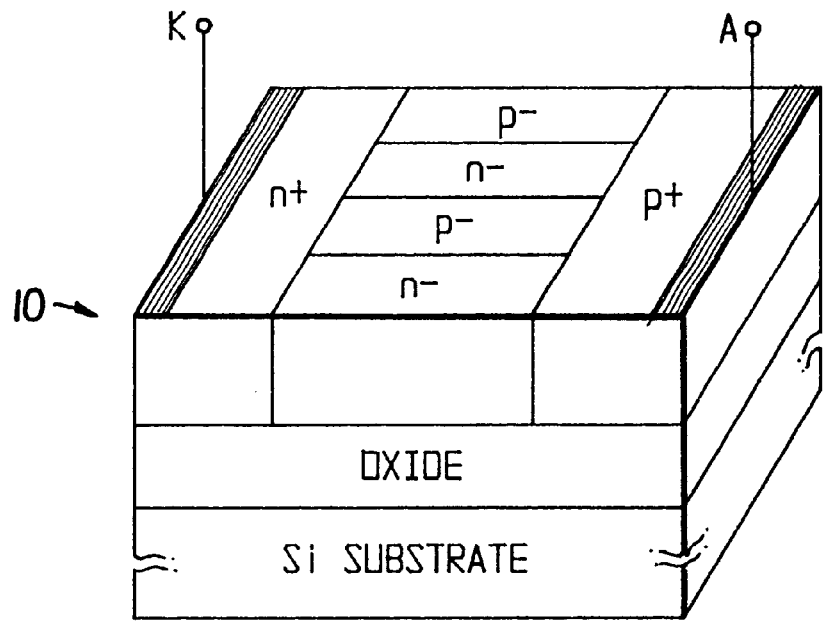
FIG. 1 is a schematic perspective diagram showing a diode employing principles employed in the present invention.
Figure 2:
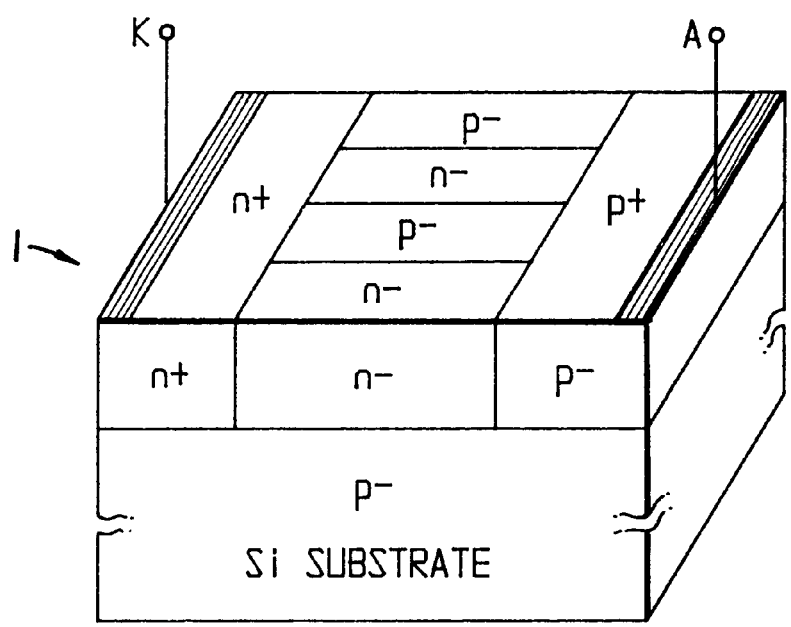
FIG. 2 is a schematic perspective diagram of the diode of FIG. 1 formed on a different substrate.

A basic junction arrangement of the type employed in the present invention is shown in FIG. 1. The arrangement of FIG. 1 is a diode having a cathode K and anode A. The diode is based upon alternate low-doped n and p silicon layers placed on a silicon on insulation (SOI) substrate. FIG. 2 shows a similar arrangement to that of FIG. 1, but formed on a lowly doped p- substrate, employing junction isolation (JI) technology for integrated circuits. In the arrangement of FIG. 2, the substrate is connected to the anode A via a p- doped layer.

Referring to FIG. 1, the diode 10 has three physical junctions, the first being the n+/p- junction adjacent the cathode K, the second p+n- junction adjacent the anode A, and the third the p-/n- junction transverse to the first and second junctions.

FIGS. 3A and 3B show the potential in conventional power diodes in breakdown mode, when a high voltage is applied to its cathode, indicating that there is a peak in the electric field at one side of each of the devices which then decreases linearly.

Referring to FIG. 4, the characteristics of an arrangement of the present invention are very different. Because of the transverse junction, and particularly central continuity of potential across the transverse junction when this is fully depleted, the lines are drawn from anode A and cathode K towards the centre of the diode, leading to a uniform distribution in both the central n- and p- regions. The arrangement of the diode of FIGS. 1 and 2 therefore realises a breakdown voltage which is much larger (in this example approximately 760 volts) than that of an equivalent conventional diode.

Figure 5:
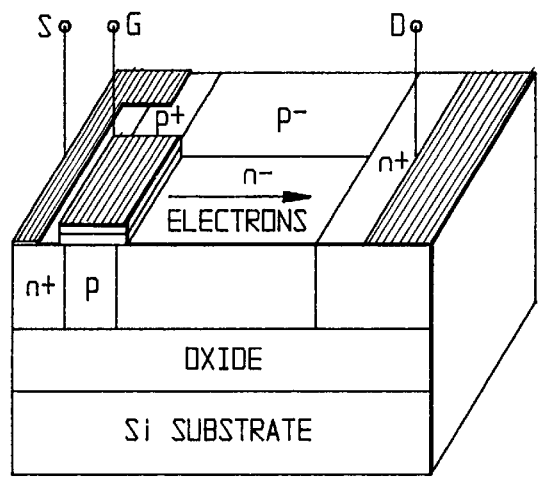
FIG. 5 is a schematic perspective view of an example of the present invention.
Figure 6:
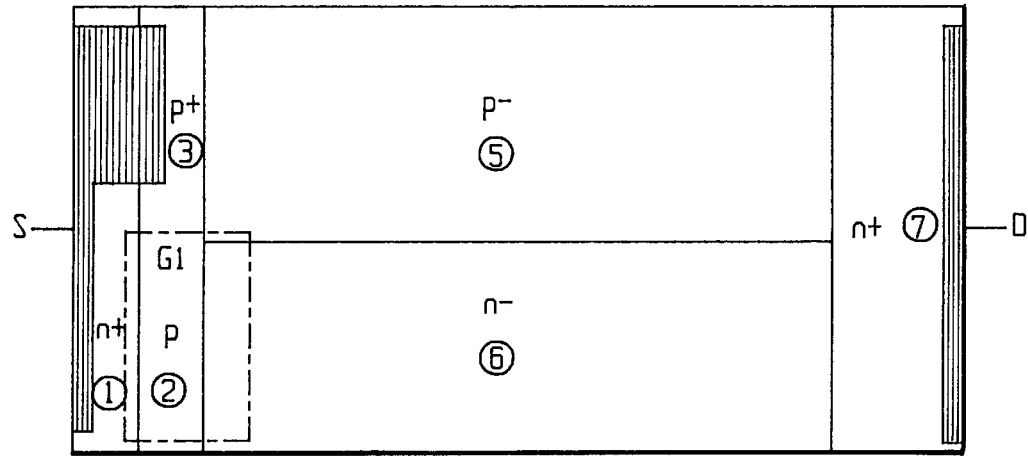
FIG. 6 is a plan view of the device of FIG. 5.
Figure 7:
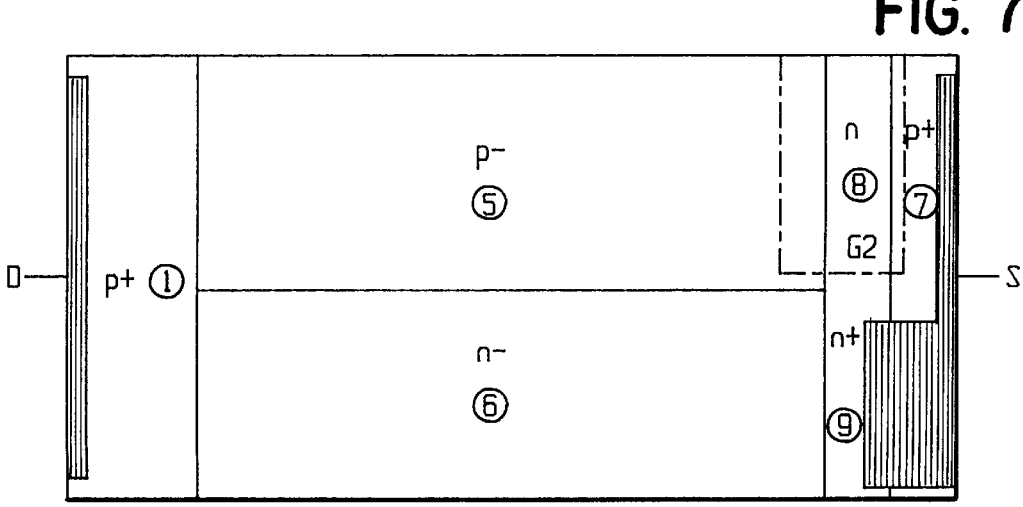
FIG. 7 is a plan view of the complementary device of FIG. 6.

FIG. 5 is a schematic diagram showing a first example of the present invention. This example shows an SOI arrangement with a substrate, but a similar arrangement on a JI substrate could be provided. In this example, a gate GI is provided to give a MOSFET arrangement. FIG. 6 shows a plan view of the arrangement of FIG. 5. In its off state, during forward voltage blocking the action of the three junctions (between regions 2/6 7/5, and 5/6), is the same as in the diode of FIG. 1. In the on state, a potential higher than a threshold voltage is applied to the gate G1 with respect to the source S, allowing electron flow from the n+ region (region 1) through the channel formed in the p layer (region 2) beneath the gate G1, n- layer (region 6), to the n+ region (region 7) and the drain D. FIG. 7 shows a device complementary to that of FIG. 6, with a gate G2 above an n- doped region.

FIGS. 8 and 9 show a further example of the present invention, in which two gates, G1, G2 are provided. The operation of this example in the off-state is the same as previous examples, but in its on-state this example has three operating modes, two which are unipolar, and one which is bipolar. The operation of the example of FIG. 8 is such that the current density passing through the device in the on state is increased, because the p– layer is used to transport holes from the drain to the source as electrons are transported in the opposite direction through the n– layer.

Referring to FIG. 9, in a first on mode, when only the gate G1 is active, a channel is induced at the surface of the p layer, allowing transportation of electrons from the n+ source S onto the drain D.

In a second mode, when only the gate G2 is active, holes are transported from the p+ layer via the channel formed in the n layer through the p– drift layer, via the p+layer to the drain D.

These two operations are similar to that of the examples of FIGS. 6 and 7.

In the bipolar mode, in which both gates G1, G2 are active and an inversion condition is obtained for the regions beneath each of the gates G1, G2. Initially, holes and electrons flow without interfering, but once the transverse p–/n– junction becomes forward biased, injection of minority carriers takes place across this junction. When a high level of injection is established and a plasma of mobile carriers is formed, the on-state resistance of the device decreases drastically. The voltage level at which this forward biasing occurs depends upon the potential distribution in the layers forming the transverse junction, which is in turn influenced by the thickness and doping of the regions of the device, together with the oxide thickness in the case of an SOI structure.

Figure 10:
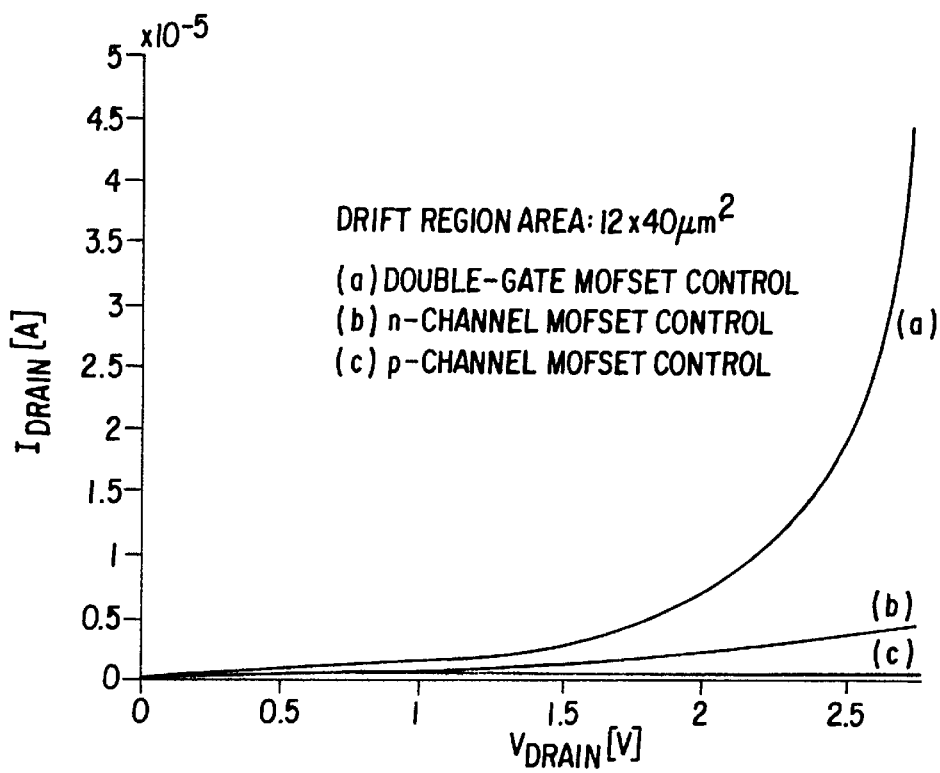
FIG. 10 is a graph showing the output characteristics of the device of FIGS. 8 and 9.
Figure 11:
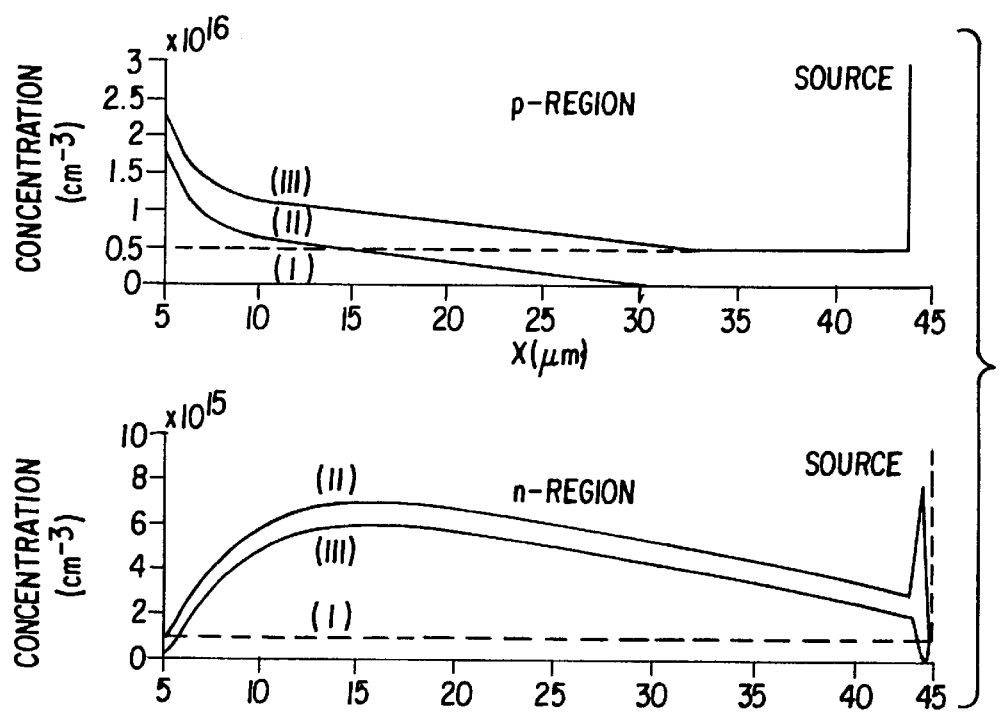
FIG. 11 is a graph showing the doping levels and electron and hole concentrations of the device of FIGS. 8 and 9 during operation.

FIG. 10 shows the output on state characteristics for the device of FIGS. 8 and 9 for the cases (a), when both gates are active, (b), when only gate G1 is active, and (c), when only gate G2 is active. From FIG. 11 it can be seen that the levels of electrons (ii) and holes (iii) in the two regions forming the transverse junction are well above their actual doping concentrations (i), indicating conductivity modulation.

With the arrangement of the present invention, unlike in conventional power devices, both the source and drain junctions are shorted, (i.e. the source electrode contacts the n+ region (1) and the p+ region (3) and thus shorts the n+/p junction, and the drain electrode contacts the p+ region (7) and the n+ region (9) and thus shorts the p+/n junction) resulting in very fast switching as, during turn off, the excess charge can be eliminated via these shorts.

Figure 12:
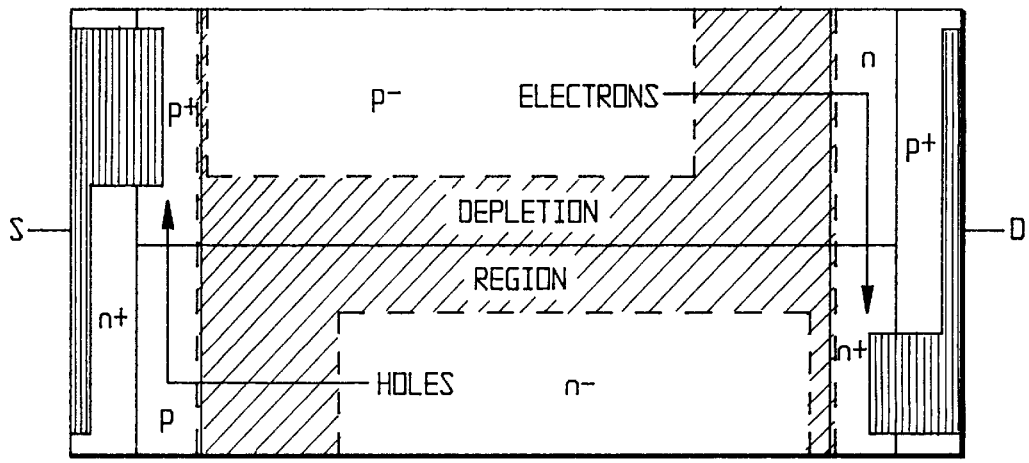
FIG. 12 is a plan view of the device of FIGS. 8 and 9 showing the depletion region during turn-off of the device.

The device is turned off by decreasing the relative potentials applied to the two gates G1, G2 below a threshold voltage necessary to form channels in the region below the two gates. The three junctions referred to previously then start a reverse recovery and the depletion region expands, as shown in FIG. 12. The electric field drives out both electrons and holes. Turn-off is complete when the depletion region covers fully the two regions forming the transverse junction.

Figure 13:
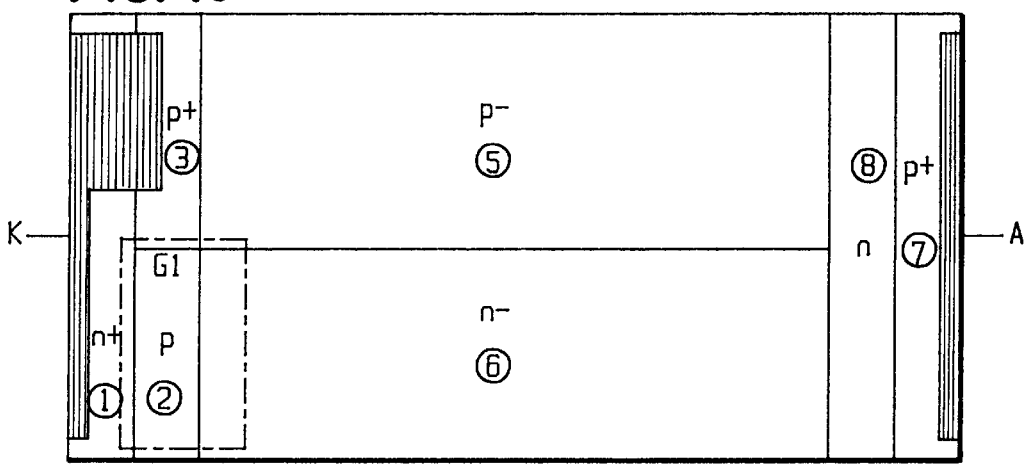
FIG. 13 is a plan view of a further example of the present invention.

FIG. 13 shows a further example of the present invention. This example of the present invention is a single gate LIGBT, which has the advantage over the single gate example of FIG. 5 that it has a reduced on-state resistance. Again, the off-state action of the device of FIG. 13 is generally the same as with the example of FIG. 1. In the on-state, when G1 has a voltage applied thereto, and there is an appropriate voltage differential between anode A and cathode K, an inversion layer forms in the region under the gate G1, allowing electron flow. Because the junction between regions 7 and 8 is forward biased in such a situation, holes are injected across this junction into the regions forming the transverse junction. Such holes can then pass via several routes through to the cathode. The presence of holes in both of the regions forming the transverse junction will ensure conductivity modulation in both of these regions, but the n– region will be more highly modulated because of enhanced injection of electrons from the cathode.

Figure 14:
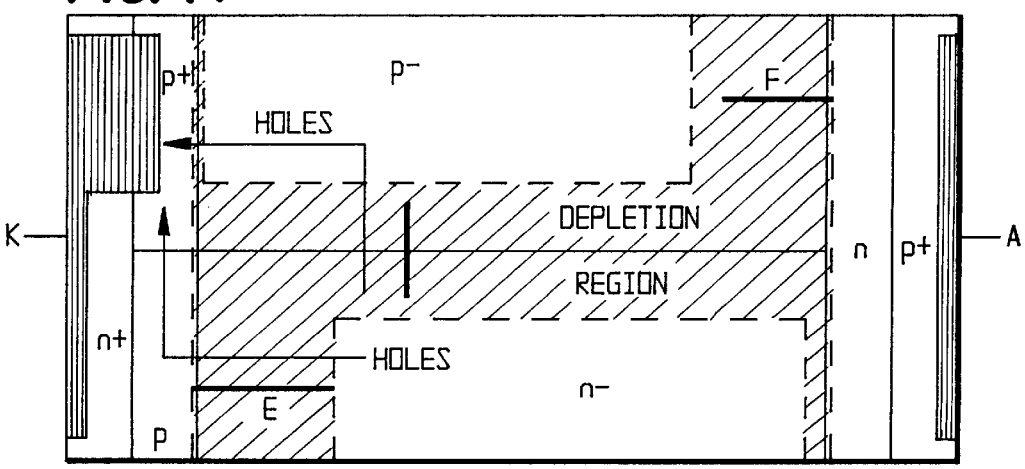
FIG. 14 is a plan view of the example of FIG. 13 showing its depletion region during turn-off.

Turn-off of the example of FIG. 13 is based upon the reverse recovery of the three fundamental junctions. FIG. 14 shows the depletion region during turnoff. Again, the electric field and expansion of the depletion region drive holes out of the device via the routes indicated. Any remaining excess charge is eliminated through recombination.

Figure 15:
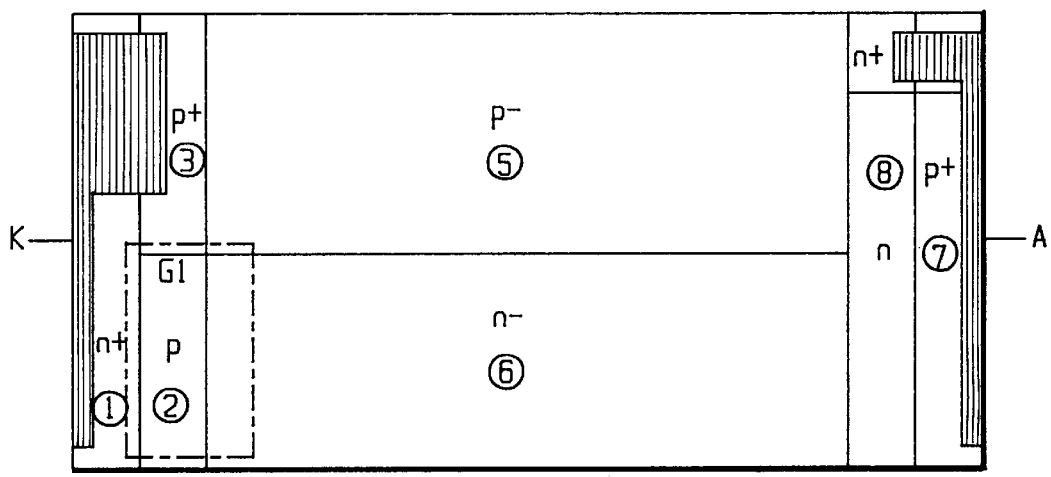
FIG. 15 is a plan view of a further example of the present invention.
Figure 16:
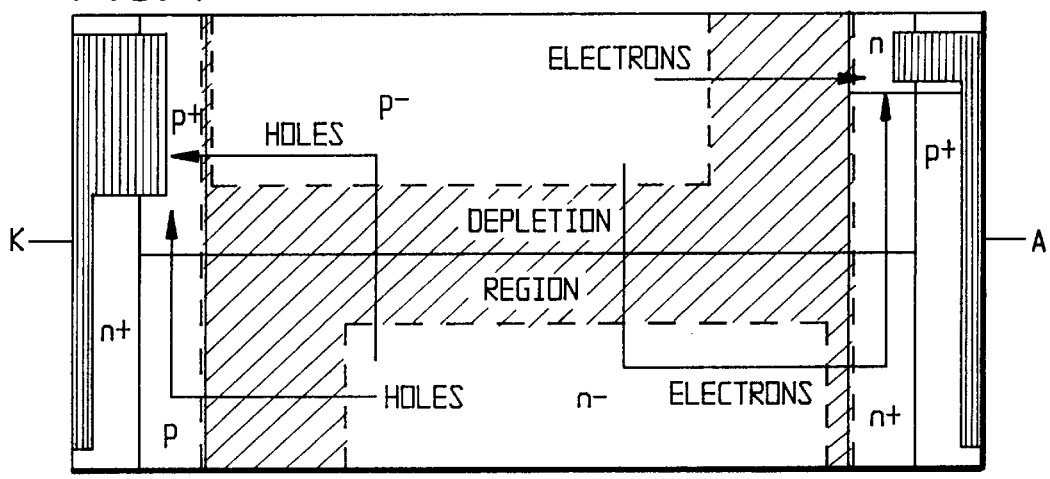
FIG. 16 is a plan view showing the depletion region of the example of FIG. 15 during turn-off.

If a reduced turn-off time is required for the device of FIG. 13, then an arrangement of the type shown in FIG. 15 can be employed. This has an arrangement in which the p+ anode region (7) is shorted to the n doped region (2) via the adjacent n+ region (3). During turn-off both electrons and holes are driven out via the route indicated in FIG. 16, increasing the speed of the device during turn-off. It will be appreciated that, however, this arrangement has higher on-state resistance.

Figure 17:
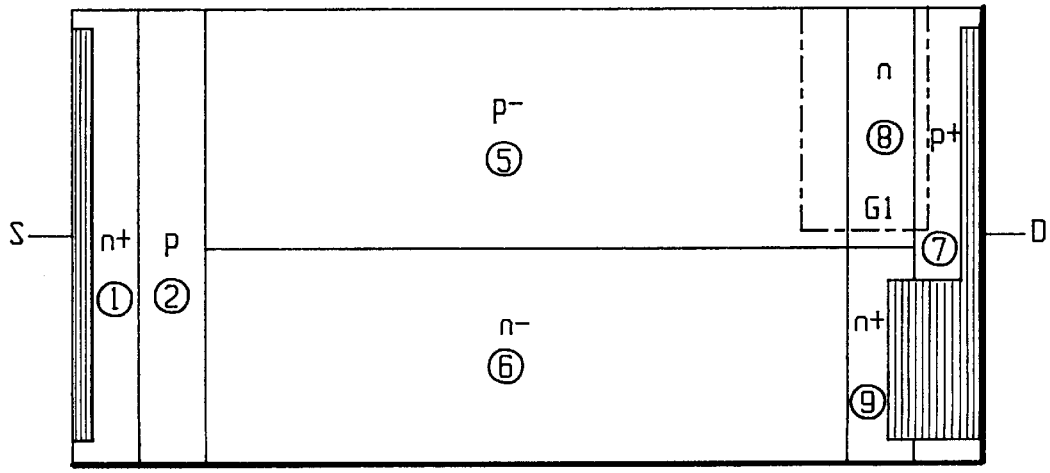
FIGS. 17 to 23 are plan views of further examples of the present invention.
Figure 18:
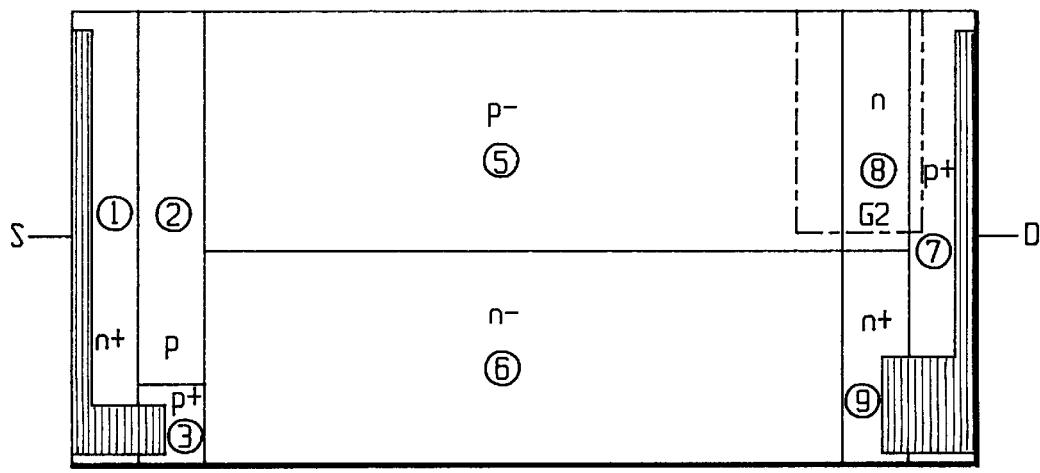

FIGS. 17 and 18 show devices complementary to those shown in FIGS. 13 through 16.

Figure 19:
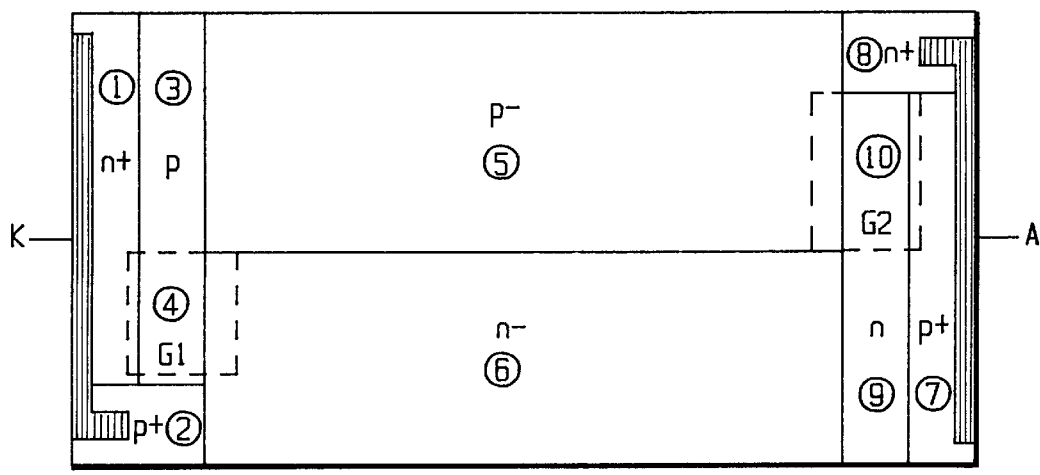

FIG. 19 shows a two gate version of arrangement of FIGS. 13 and 15. As with previous examples, the off-state characteristic operates in accordance with the principles of the arrangement of FIG. 1, and the on-state has three operations.

In the on-state, when a potential is applied to G1 to generate a potential difference between gate G1 and cathode K that is greater than the MOS threshold voltage, a channel is formed in the region beneath the gate G1. This allows electron flow which generates a forward bias at the junction between regions 7 and 9 adjacent to the anode A. This forward biasing results in an injection of holes from region 7 into regions 9 and 6. Again conductivity modulation is generated, resulting in a low on-resistance. It should be noted that during this operation, the junction between regions 7 and 10 may also become forward biased, injecting holes from region 7 to region 5 via region 10, according to FIG. 19 and then transversely down through regions 3 and 4 to region 2 and the cathode. When only gate G2 has a potential applied the operation is similar and symmetrical to that when a potential is applied only to gate G1.

Figure 20:
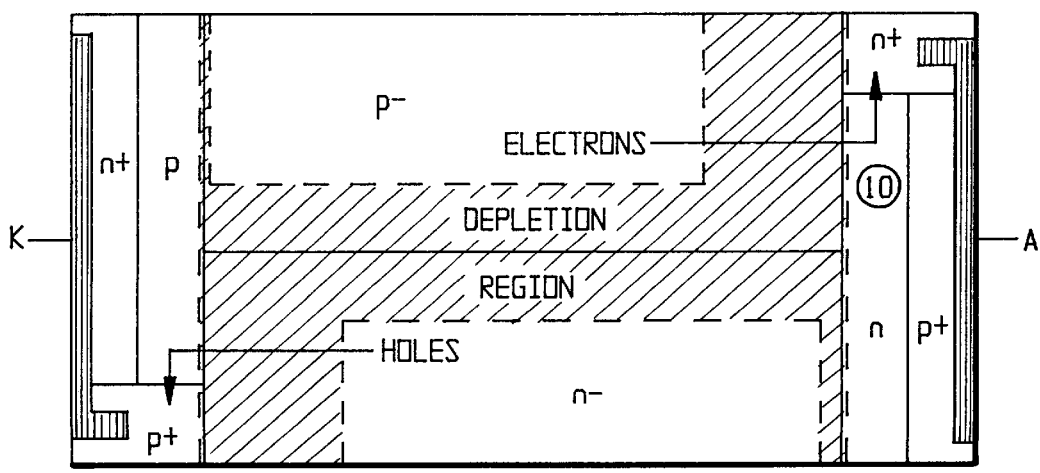

The device is designed, however, to have a normal operation which involves a potential being applied to both gates G1 and G2. This leads to a high degree of modulation and extremely low on-state resistance. Holes are injected via the junction between regions 7 and 9. Electrons are injected via the junction between regions 1 and 3, resulting in the low on-state resistance. The device is switched off by removing the potential voltage applied to gates G1 and G2, generating a depletion region as shown in FIG. 20. The shorts in the anode A and cathode K mean that the device of this example is very fast and has very short switching times.

Figure 21:
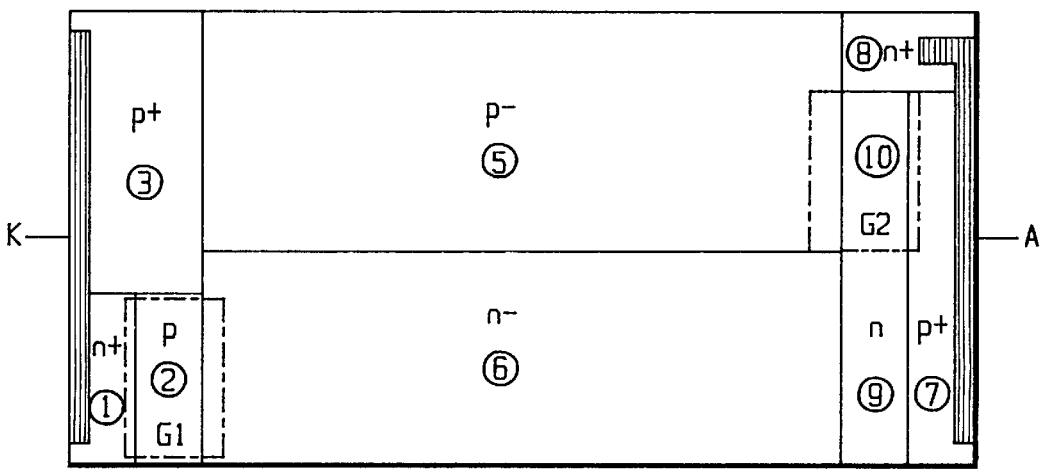

FIG. 21 shows a further example of the present invention, in which the device with two gates G1, G2 is provided. This device is generally a combination of the example of FIG. 5 and FIG. 13. The off-state operation of this device is generally similar to that of previous examples. Again, the on-state operation is of three different types.

Firstly, if a potential is applied only to gate G2, then the device has a unipolar transport of holes from the anode A via a channel formed by the potential on the gate G2 in the region beneath the gate G2. The holes are then transported through the p− region 5 and the p+ region 3 to the cathode K. If only gate G1 is active, then the device allows electrons to flow from the cathode through the region under gate G1 and through the n− region 6 to the anode A. In this case, the on-state resistance will be lower than when only gate G2 is active, but there is a snap-back characteristic which may be undesirable in certain applications.

If potentials are applied to both gates G1, G2 then the resistance in the on-state is reduced considerably and there is no snap-back characteristic.

Figure 22:
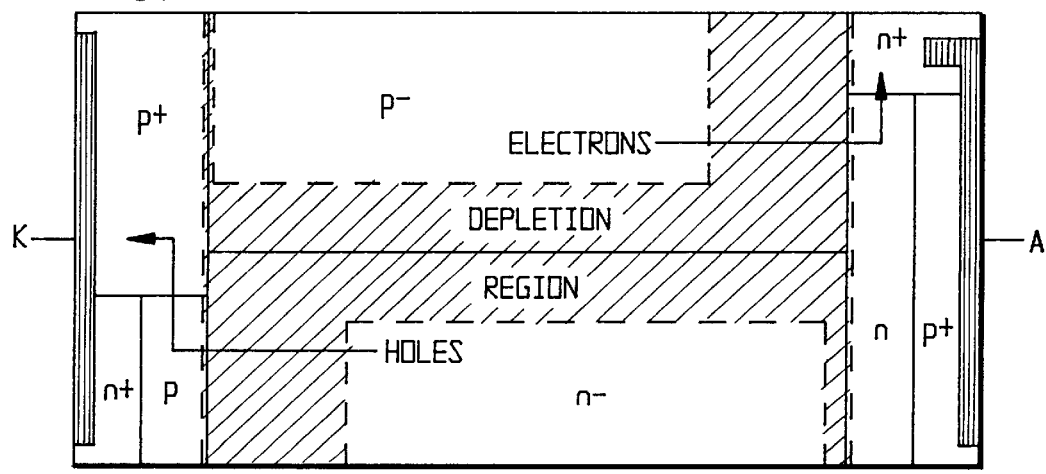

FIG. 22 shows the depletion region of the device of FIG. 21 as the device is being made inactive by removing potentials from gate G1 and G2. The turn-off operation of this example is similar to those of previous examples.

Figure 23:
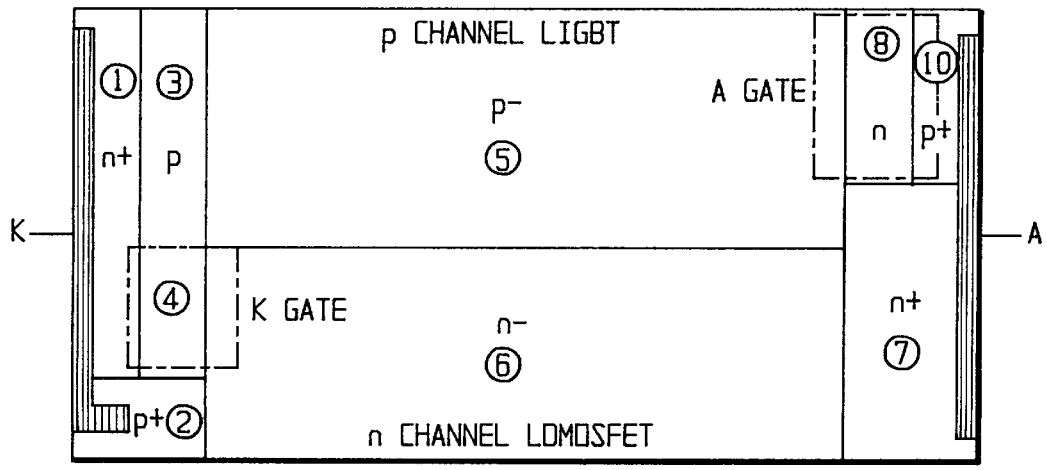

FIG. 23 shows a device complementary to that of FIG. 21.

What is claimed is:

1. A semiconductor device having first and second electrical terminals, the device comprising:

at least a first junction of an n/p or p/n type one n/p or p/n first junction adjacent the first terminal having a first polarity, and being physically connected to a first surface;

at least a second junction adjacent the second terminal having a second polarity opposite the first polarity, and being physically connected to the first surface;

at least one n/p or p/n junction physically connected to the first surface and disposed between and in contact with the first and second junctions and arranged to be transverse thereto; and at least one gate terminal in contact with the p or n doped region of the first junction or the n or p doped region of the second junction.

2. A device according to claim 1, arranged to operate as a MOSFET.

3. A device according to claim 1, arranged to operate as an LIGBT.

4. A device according to claim 1, wherein the device has more than one gate, each of the gates arranged to control the flow of carriers through the device.

5. A device according to claim 4, arranged to operate as a double gated MOSFET.

6. A device according to claim 4, arranged to operate as a double gated LIGBT.

7. A device according to claim 4, arranged to operate both as a LIGBT and a MOSFET.

8. A device according to claim 1, wherein the device is formed on a substrate comprising an oxide layer on a silicon substrate.

9. A device according to claim 1, wherein the device is formed on a p− or n− doped silicon substrate.

10. A device according to claim 1, formed as part of an integrated circuit.

11. A semiconductor device having first and second electrical terminals, the device comprising:

at least a first junction of either a p/n or n/p type physically connected to a first surface and having a corresponding doped region adjacent the first terminal and having a first polarity;

at least a second junction physically connected to the first surface, and having a corresponding doped region opposite the first junction adjacent the second terminal and having a second polarity opposite the first polarity;

at least one junction of either said first or second polarity disposed between the first and second junctions being arranged transverse thereto and connected to the first and second junctions and physically connected to the first surface; and at least one gate terminal in contact with at least one of the doped regions of the first junction and the second junction.

12. A device according to claim 11, wherein the first surface comprises a common top surface of the device.

* * * * *

UNITED STATES PATENT AND TRADEMARK OFFICE
CERTIFICATE OF CORRECTION

PATENT NO.   : 6,111,289
DATED        : August 29, 2000
INVENTOR(S)  : Florin, Udrea It is certified that error appears in the above-identified patent and that said Letters Patent is hereby corrected as shown below:

<u>Title page,</u>
Item [73], should read
-- Assignee:    Fuji Electric Company Ltd.
                Matsuomoto, Japan
                a 50% interest --

Signed and Sealed this

Seventeenth Day of December, 2002

JAMES E. ROGAN
*Director of the United States Patent and Trademark Office*